(12) United States Patent
Bishop et al.

(10) Patent No.: US 10,651,334 B2
(45) Date of Patent: May 12, 2020

(54) SEMITRANSPARENT CHALCOGEN SOLAR CELL

(71) Applicant: International Business Machines Corporation, Armonk, NY (US)

(72) Inventors: Douglas M. Bishop, New York, NY (US); Yun Seog Lee, White Plains, NY (US); Saurabh Singh, Yonkers, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/431,878

(22) Filed: Feb. 14, 2017

(65) Prior Publication Data
US 2018/0233609 A1    Aug. 16, 2018

(51) Int. Cl.
*H01L 31/18* (2006.01)
*H01L 31/0224* (2006.01)
(Continued)

(52) U.S. Cl.
CPC ...... *H01L 31/1884* (2013.01); *H01L 31/0272* (2013.01); *H01L 31/022425* (2013.01);
(Continued)

(58) Field of Classification Search
CPC .......... H01L 31/0272; H01L 31/02725; H01L 31/03923; H01L 31/0326; H01L 31/0327;
(Continued)

(56) References Cited

U.S. PATENT DOCUMENTS 3,990,095 A     11/1976   Busanovich et al.
4,025,815 A  *  5/1977    Kurokawa .............. H01J 29/45
                                                    313/371
(Continued)

FOREIGN PATENT DOCUMENTS

EP            0109994 A1      6/1984

OTHER PUBLICATIONS

K. Tennakone et al., "Nanoporous n-TiO2/selenium/p-CuCNS photovoltaic cell", Journal of Physics D Applied Physics 31, p. 2326-2330 (Year: 1998).*

(Continued)

*Primary Examiner* — Eric R Smith
(74) *Attorney, Agent, or Firm* — Vazken Alexanian; Michael J. Chang, LLC

(57) ABSTRACT

Semitransparent chalcogen solar cells and techniques for fabrication thereof are provided. In one aspect, a method of forming a solar cell includes: forming a first transparent contact on a substrate; depositing an n-type layer on the first transparent contact; depositing a p-type chalcogen absorber layer on the n-type layer, wherein a p-n junction is formed between the p-type chalcogen absorber layer and the n-type layer; depositing a protective interlayer onto the p-type chalcogen absorber layer, wherein the protective interlayer fully covers the p-type chalcogen absorber layer; and forming a second transparent contact on the interlayer, wherein the interlayer being disposed between the p-type chalcogen absorber layer and the second transparent contact serves to protect the p-n junction during the forming of the second transparent contact. Solar cells and other methods for formation thereof are also provided.

9 Claims, 4 Drawing Sheets

Primary direction of light

Secondary direction of light

(51) Int. Cl.
*H01L 31/0468* (2014.01)
*H01L 31/0749* (2012.01)
*H01L 31/0272* (2006.01)

(52) U.S. Cl.
CPC .. *H01L 31/022466* (2013.01); *H01L 31/0468* (2014.12); *H01L 31/0749* (2013.01); *Y02P 70/521* (2015.11)

(58) Field of Classification Search
CPC ............. H01L 31/0322; H01L 31/0323; H01L 31/0749
See application file for complete search history.

(56) References Cited

U.S. PATENT DOCUMENTS

| | | | |
|---|---|---|---|
| 4,064,522 A | 12/1977 | Shaw et al. | |
| 4,259,122 A | 3/1981 | Purwin et al. | |
| 4,713,518 A * | 12/1987 | Yamazaki | H01L 21/302 136/244 |
| 4,816,715 A * | 3/1989 | Unnai | H01J 29/456 313/366 |
| 5,196,702 A * | 3/1993 | Tsuji | H04N 5/32 250/591 |
| 8,124,870 B2 | 2/2012 | Woods et al. | |
| 9,159,850 B2 | 10/2015 | Krasnov | |
| 2002/0175271 A1* | 11/2002 | Shoji | G03G 15/758 250/214.1 |
| 2008/0217547 A1* | 9/2008 | Lee | G01T 1/24 250/370.09 |
| 2010/0029037 A1* | 2/2010 | Tokuda | G01T 1/24 438/97 |
| 2011/0297217 A1* | 12/2011 | Barkhouse | H01L 51/42 136/255 |
| 2012/0061247 A1* | 3/2012 | Ahmed | C25D 3/54 205/170 |
| 2012/0186623 A1 | 7/2012 | Bulovic et al. | |
| 2013/0292655 A1* | 11/2013 | Becker | C23C 14/024 257/40 |
| 2014/0318609 A1 | 10/2014 | Martorell Pena et al. | |
| 2015/0013746 A1* | 1/2015 | Shukh | H01L 31/053 136/244 |
| 2015/0122324 A1 | 5/2015 | Eisaman et al. | |
| 2015/0255651 A1 | 9/2015 | Barr et al. | |
| 2015/0380450 A1* | 12/2015 | Okamoto | H01L 27/14603 257/43 |
| 2017/0018371 A1* | 1/2017 | Suzuka | H01L 51/0003 |
| 2017/0338430 A1* | 11/2017 | Qi | H01L 51/002 |
| 2017/0373213 A1 | 12/2017 | Gershon et al. | |

OTHER PUBLICATIONS

Ablayev et al., "Semitransparent solar modules based on amorphous and microcrystalline silicon," Journal of Physics: Conference Series, vol. 572 (Dec. 2014) (6 pages).

Goushi et al., "Fabrication of pentanary Cu(InGa)(SeS)2 absorbers by selenization and sulfurization," Solar Energy Materials & Solar Cells 93 (Mar. 2009), pp. 1318-1320.

T. Nakada et al., "Polycrystalline thin-film TiO2/Se solar cells," Japanese Journal of Applied Physics, vol. 24, No. 7A, Jul. 1985, pp. L536-L538.

G. Cheek et al., "Thin film PV: Moving at the speed of solar," IEEE 39th Photovoltaic Specialists Conference (PVSC), Jun. 2013, pp. 3407-3410.

S. Nishiwaki et al., "A stacked chalcopyrite thin-film tandem solar cell with 1.2V open-circuit voltage," Progress in Photovoltaics vol. 11, issue 4, Abstract (Jun. 2003) (1 page).

R. Kaigawa et al., "Tandem solar cells with Cu(In,Ga)S2 top cells on ZnO coated Substrates," Solar Energy Materials and Solar Cells, vol. 94, issue 11, Abstract (Nov. 2010) (1 page).

M. Freunek et al., "Maximum efficiencies of indoor photovoltaic devices," IEEE J. Photovoltaics, vol. 3, No. 1, Abstract, Jan. 2013 (1 page).

Nguyen et al., "3-D solar cells by electrochemical-deposited Se layer as extremely-thin absorber and hole conducting layer on nanocrystalline TiO2 electrode," Nanoscale Res. Lett. 8, 8 (Jan. 2013) (7 pages).

K. Wang et al., "Selenium as a photoabsorber for inorganic-organic hybrid solar cells," Phys. Chem. Chem. Phys. 16, 23316-9 (Nov. 2014) (4 pages).

S. Ito et al., "Electrochemical Deposition of Te and Se on Flat TiO2 for Solar Cell Application," Int. J. Photoenergy 2014, 1-5 (Apr. 2014).

* cited by examiner

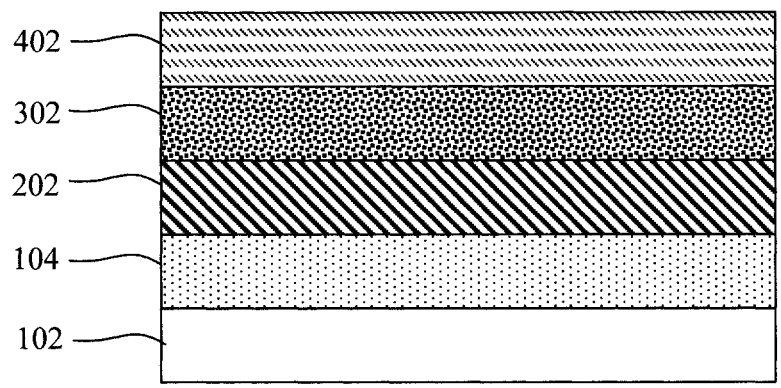
FIG. 4
Secondary direction of light
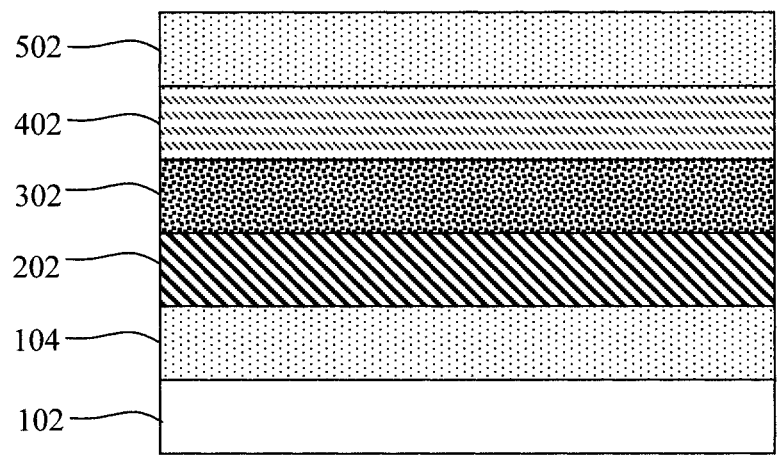
FIG. 5
Primary direction of light

SEMITRANSPARENT CHALCOGEN SOLAR CELL

FIELD OF THE INVENTION

The present invention relates to photovoltaic-based devices, and more particularly, to semitransparent chalcogen solar cells.

BACKGROUND OF THE INVENTION

Semitransparent solar cells are desirable for aesthetic and practical design reasons including applications in architectural glass, multi junction photovoltaic devices, wearable and other consumer electronic applications, etc.

Traditional solar cells are opaque and even conventional solar materials which can be made semitransparent typically employ a metal back electrode which blocks light. Neither options prove viable for semitransparent solar cell applications.

Some examples of semitransparent solar cells exist such as amorphous silicon and organic solar cells. See, for example, Ablayev et al., "Semitransparent solar modules based on amorphous and microcrystalline silicon," Journal of Physics: Conference Series, vol. 572 (December 2014) (amorphous silicon solar cells) and U.S. Patent Application Publication Number 2012/0186623 by Bulovic et al., entitled "Transparent Photovoltaic Cells" (organic solar cells). These designs however suffer from either light-induced degradation or long-term stability issues.

Therefore, an improved semitransparent solar cell design would be desirable.

SUMMARY OF THE INVENTION

The present invention provides semitransparent chalcogen solar cells and techniques for fabrication thereof. In one aspect of the invention, a method of forming a solar cell is provided. The method includes the steps of: forming a first transparent contact on a substrate; depositing an n-type layer on the first transparent contact; depositing a p-type chalcogen absorber layer on the n-type layer, wherein a p-n junction is formed between the p-type chalcogen absorber layer and the n-type layer; depositing a protective interlayer onto the p-type chalcogen absorber layer, wherein the protective interlayer fully covers the p-type chalcogen absorber layer; and forming a second transparent contact on the interlayer, wherein the interlayer being disposed between the p-type chalcogen absorber layer and the second transparent contact serves to protect the p-n junction during the forming of the second transparent contact.

In another aspect of the invention, another method of forming a solar cell is provided. The method includes the steps of: forming a first transparent contact on a substrate; depositing a p-type chalcogen absorber layer on the first transparent contact; depositing an n-type layer on the p-type chalcogen absorber layer, wherein a p-n junction is formed between the n-type layer and the p-type chalcogen absorber layer; depositing a protective interlayer onto the n-type layer; and forming a second transparent contact on the protective interlayer, wherein the protective interlayer being disposed between the n-type layer and the second transparent contact serves to protect the p-n junction during the forming of the second transparent contact.

In yet another aspect of the invention, a solar cell is provided. The solar cell includes: a substrate; a first transparent contact disposed on the substrate; an n-type layer disposed on the first transparent contact; a p-type chalcogen absorber layer disposed on the n-type layer, wherein a p-n junction is formed between the p-type chalcogen absorber layer and the n-type layer; a protective interlayer disposed on the p-type chalcogen absorber layer, wherein the protective interlayer fully covers the p-type chalcogen absorber layer; and a second transparent contact disposed on the interlayer.

In still yet another aspect of the invention, another solar cell is provided. The solar cell includes: a substrate; a first transparent contact disposed on the substrate; a p-type chalcogen absorber layer disposed on the first transparent contact; an n-type layer disposed on the p-type chalcogen absorber layer, wherein a p-n junction is formed between the n-type layer and the p-type chalcogen absorber layer; a protective interlayer disposed on the n-type layer, wherein the protective interlayer fully covers the n-type layer; and a second transparent contact disposed on the protective interlayer.

A more complete understanding of the present invention, as well as further features and advantages of the present invention, will be obtained by reference to the following detailed description and drawings.

BRIEF DESCRIPTION OF THE DRAWINGS

FIG. 4 is a cross-sectional diagram illustrating a protective interlayer having been deposited onto the p-type chalcogen absorber layer according to an embodiment of the present invention;

FIG. 5 is a cross-sectional diagram illustrating a second (back) transparent contact having been formed on the protective interlayer according to an embodiment of the present invention;

DETAILED DESCRIPTION OF PREFERRED EMBODIMENTS

Figure 1:
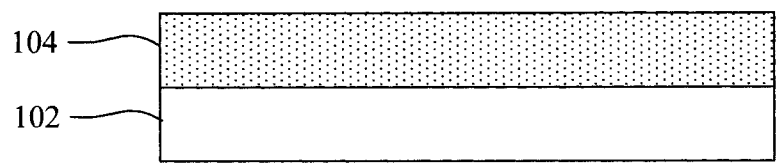
FIG. 1 is a cross-sectional diagram illustrating a first (front) transparent contact having been formed on a substrate according to an embodiment of the present invention.

As provided above, semi-transparent solar cells are desirable for a variety of applications, such as architectural glass, multi junction photovoltaic devices, wearable and other consumer electronic applications. For example, architectural glass with integrated photovoltaics can be employed in buildings to enable harnessing electricity through the windows themselves. Combining photovoltaics with wearables, such as sunglasses, provides a reliable power source for mobile devices. See, for example, U.S. patent application Ser. No. 15/431,867, by Bishop et al., entitled "Ultraviolet-Blocking Photovoltaic Sunglasses," the contents of which are incorporated by reference as if fully set forth herein. In addition, having a transparent back contact allows reflected light to be captured from both sides of a solar cell which can allow for increased power production in many situations.

Unfortunately, conventional solar cells are opaque with a low band gap (<1.6 eV) that blocks the vast majority of visible light. Furthermore, conventional solar cells typically employ structures, such as metal electrodes/contacts, that undesirably block light. Thus, improved solar cell designs for semitransparent applications are needed.

Advantageously, provided herein are chalcogen-based solar cell designs that employ a transparent back contact. By "chalcogen-based" it is meant that the absorber used in the present solar cell designs is a chalcogen material, such as sulfur (S), selenium (Se), and/or tellurium (Te)—see below. Advantageously, pure or mixed chalcogen absorbers have band gaps >1.6 eV when the Te content is less than 10% and therefore only absorb a portion of the visible spectrum, enabling them to appear semitransparent. The visible spectrum is classified as from 390 nanometers (nm) to 700 nm. Selenium, with a band gap of about 1.9 eV depending on fabrication, is mainly transparent in the longer range above 600 nm, and thus from 2% and 50% of the 600 nm light and from 10% to 70% of the 700 nm light is transmitted. By comparison, mainstream solar technologies such as silicon (Si)—, copper-indium-gallium-sulfur/selenium (CIGS)—, cadmium telluride (CdTe)—, gallium arsenide (GaAs)—, etc. based absorbers are not well suited for semitransparent applications due to strong absorption in all visible spectra.

A transparent back contact allows light to enter the solar cell from either side of the device allowing for improved light capture due to either simultaneous light from multiple directions, or to allow efficient capture of light regardless of the orientation of the device. As will be described in detail below, a reflector could also be used on one side to increase light moving through the solar cell.

Replacing the opaque metal contacts/electrodes used in traditional solar cells is however not a simple task, as the implementation of a transparent back contact solar cell presents some notable challenges. For instance, many solar cells are processed at high temperatures which can damage or destroy the transparent contact layers. CIGS solar cell fabrication, for instance, can involve anneals at temperatures exceeding 300° C. (e.g., 450° C.). See, for example, Goushi et al., "Fabrication of pentanary Cu(InGa)(SeS)$_2$ absorbers by selenization and sulfurization," Solar Energy Materials & Solar Cells 93 (March 2009), pgs. 1318-1320, the contents of which are incorporated by reference as if fully set forth herein. Transparent contact materials are damaged at these high temperatures. Further, even if issues with high temperature damage can be solved, simply replacing the typical metal contacts with a conventional transparent electrode would yield a device with reduced performance due to damage from the fabrication process. Depositing a transparent electrode material after the absorber layer can cause damage to the absorber layer, resulting in decreased performance.

The present techniques are now described in detail. A superstrate fabrication process flow is employed in one exemplary embodiment, and a substrate process flow in another exemplary embodiment. The different process flows, superstrate or substrate, involve the fabrication steps being performed in a different order, i.e., the fabrication steps for a substrate process flow are performed in the reverse order for a superstrate process flow, and vice versa. In the completed solar cell devices, the difference between a superstrate and a substrate configuration exists primarily in which end light enters the solar cell device. With a superstrate configuration, light primarily enters the solar cell device at the same end as the substrate (i.e., light primarily enters the device through the substrate. By contrast, with a substrate configuration, light primarily enters the solar cell device at an opposite end of the device from the substrate. However, as noted above, with the present semitransparent solar cells some light can be captured at either end of the device. The present solar cell devices are fabricated as a stack of layers (e.g., films) one on top of the other, and transparent contacts are provided at opposite ends of the stack. In the description that follows, the transparent contact at the end of the solar cell through which light primarily enters is also referred to as the front transparent contact whereas the transparent contact at the opposite end of the solar cell is referred to as the back transparent contact. The terms "first" and "second" may also be used throughout to distinguish between the transparent contacts and/or other structures in the solar cell.

The first embodiment described involves a superstrate process flow. As shown in FIG. 1, the process begins with a substrate 102 and a first (front) transparent contact 104 formed on the substrate 102. Preferably, the substrate 102 is formed from a transparent material, such as glass or plastic. By way of example only, the substrate 102 can be a material on which a film of the present photovoltaics is formed. For instance, the substrate can be glass of a configuration, composition, e.g., suitable for forming architectural glass, and the present photovoltaic film is built on the inside and/or outside of the glass. As is known in the art, soda lime glass (SLG) is suitable for window applications, and can be formed using techniques such as plate glass processing. Further, the substrate can be a lens material for incorporation into eyewear (such as glass, plastic, and/or polycarbonate), and the photovoltaic film is formed directly on the lens. See Bishop et al.

The first transparent contact is preferably formed from a material having a bandgap of greater than about 2.5. For instance, according to an exemplary embodiment, the first transparent contact 104 is formed from a transparent conducting oxide (TCO) such as indium-tin-oxide (ITO), fluorine-doped tin oxide (FTO), and/or aluminum-doped zinc oxide (AZO). The first transparent contact 104 can be deposited onto the substrate 102 using a process such as sputtering, evaporation, or solution processing (e.g., casting).

Figure 2:
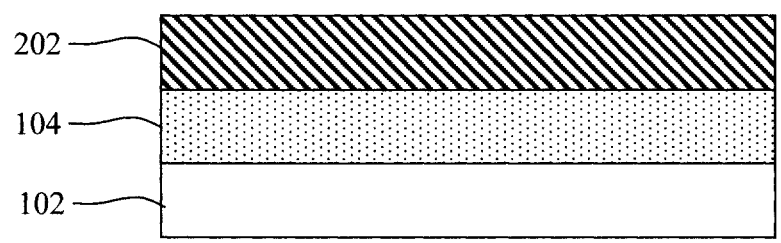
FIG. 2 is a cross-sectional diagram illustrating an n-type layer having been formed on the first transparent contact according to an embodiment of the present invention.

An n-type layer 202 is next formed on the first transparent contact 104. See FIG. 2. The n-type layer 202 (along with a p-type absorber 302—see below) form a p-n junction. Suitable n-type materials include, but are not limited to, cadmium oxide (CdO), cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), aluminum oxide ($Al_2O_3$), titanium oxide ($TiO_2$), and/or a zinc magnesium oxide (ZMO) material with the formula $Zn_{1-x}Mg_xO$, wherein $0\leq x\leq0.4$. The n-type material can be deposited onto the first transparent contact 104 by sputtering, evaporation, or solution processing (e.g., casting), to form n-type layer 202.

Figure 3:
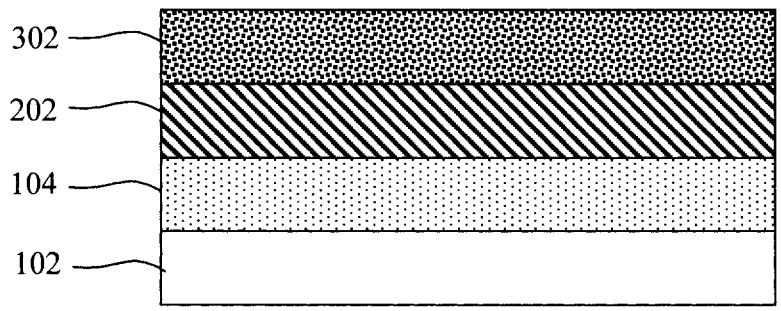
FIG. 3 is a cross-sectional diagram illustrating a p-type chalcogen absorber layer having been formed on the n-type layer according to an embodiment of the present invention.

A (p-type) chalcogen absorber layer 302 is then deposited on the n-type layer 202, forming a p-n junction therebetween. See FIG. 3. According to an exemplary embodiment, the absorber layer 302 includes a chalcogen such as S, Se, and/or Te. As provided above, S, Se, and/or Te are high band gap materials that permit a large amount of visible light to pass therethrough, thus making these chalcogens ideal choices for semitransparent solar cell applications. In one exemplary embodiment in particular, the absorber layer 302 is formed from pure Se (i.e., the absorber layer 302 is from about 90% to about 99.999%, and ranges therebetween, Se). The absorber layer 302 can be deposited using a process such as evaporation or solution processing (e.g., casting).

Further, it has been found that incorporating a fullerene-based semiconductor layer in contact with the Se layer in an Se-based solar cell can reduce I-V hysteresis, as well as improve power-conversion-efficiency voltage and open-circuit voltage in such solar devices. See, for example, U.S. patent application Ser. No. 15/431,900, by Bishop et al., entitled "Selenium-Fullerene Heterojunction Solar Cell," the contents of which are incorporated by reference as if fully set forth herein.

The ability to form the back transparent contact on the stack over the absorber layer 302 presents a notable fabrication challenge. For instance, if one were to simply sputter a high band gap material such as one of the above-described TCOs directly onto the absorber layer 302, the resulting sputter damage (due to ion bombardment) to the n-type layer 202/absorber layer 302 p-n junction would hurt device performance. Advantageously, it has been found herein that first placing a protective interlayer on the absorber layer 302 can serve to protect the absorber layer 302 during subsequent deposition of the back transparent contact. Hence, this protective layer is an 'interlayer' between the absorber layer 302/p-n junction and the back transparent contact. In the superstrate configuration, the protective interlayer can be formed from a high workfunction material which can advantageously be used to tune the workfunction of the back transparent contact.

Thus, as shown in FIG. 4, a protective interlayer 402 is next deposited onto (and fully covering an exposed side of) the absorber layer 302. According to an exemplary embodiment, the protective interlayer 402 is formed from a high workfunction material. As shown in FIG. 4, the protective interlayer 402 fully covers/protects the absorber layer 302. The term "high workfunction," as used herein, refers to a material having a workfunction of greater than about 5.2 electron volts (eV). Molybdenum trioxide ($MoO_3$) for instance has a workfunction of about 5.3 eV, and thus is suitable for use as the high workfunction material in the protective interlayer 402. A high workfunction protective interlayer 402 serves both to provide a barrier and to potentially induce an electrostatic field which repels electrons from the back contact (e.g., back contact 502, see below). This reduces recombination with holes at the back contact and thus increases efficiency. When depositing a material onto the absorber layer 302, it is important to avoid damage. Thus, according to an exemplary embodiment, the protective interlayer 402 is deposited onto the absorber layer 302 using a process such as evaporation.

With the protective interlayer 402 in place to protect the absorber layer 302 (and underlying layers), a second (back) transparent contact 502 is formed on the protective interlayer 402. See FIG. 5. As provided above, the transparent contacts are preferably formed from a material having a bandgap of greater than about 2.5. For instance, according to an exemplary embodiment, the second transparent contact 502 is formed from a TCO such as ITO, FTO, and/or AZO. The second transparent contact 502 can be deposited onto the protective interlayer 402 using a process such as sputtering, evaporation, or solution processing (e.g., casting).

As shown in FIG. 5, the primary direction at which light enters the solar cell device is at the same end as the substrate 102, i.e., light enters the solar cell device through the substrate. This is the superstrate configuration referenced above. However, as shown in FIG. 5, light can also enter the solar cell device from the end opposite the substrate. Namely, the ability to place transparent contacts both at the front and back of the device (and without light obstructing metal contacts) via the present interlayer enables light to enter from both the front and the back of the device. This configuration is also referred to herein as a bi-facial design, wherein both sides of the solar cell device can 'face' and capture light. Thus, the present designs are capable of harnessing light energy regardless of the orientation of the solar cell device (whichever side(s) is/are facing the light).

Figure 6:
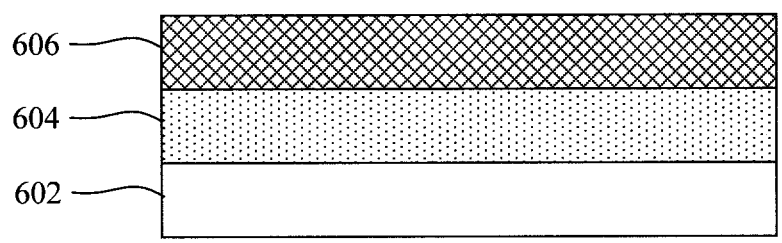
FIG. 6 is a cross-sectional diagram illustrating, according to an alternative embodiment, a first (back) transparent contact having been formed on a substrate, and an optional electron-blocking layer having been formed on the first (back) transparent contact according to an embodiment of the present invention.

Embodiments are also contemplated herein where a substrate (rather than superstrate) process flow is employed. With a substrate process flow, the layers in the stack are basically deposited in the reverse order on the substrate (as compared to a superstrate configuration). For instance, the (p-type) absorber layer gets placed before the n-type layer (which is the reverse from the superstrate flow—see above). Notwithstanding, the process begins in the same general manner as shown in FIG. 6 with a substrate 602 and a first transparent contact 604 being formed on the substrate 602. In this case, however, the first transparent contact 604 is considered a back contact since light will primarily enter the device through the other end of the stack (i.e., the side opposite the substrate—see below).

As above, a variety of different substrate materials are suitable, however it is preferable that the substrate is transparent to light. As described above, some application-specific embodiments anticipated herein include forming a film of the present photovoltaics on architectural glass, wearables such as sunglasses, etc. In that case, the substrate 602 can include a material suited for the particular application, e.g., SLG for windows, glass, plastic, polycarbonate for sunglasses, etc. upon which the present solar cell device is directly built.

The first transparent contact 604 is preferably formed from a material having a bandgap of greater than about 2.5, e.g., a TCO such as ITO, FTO, and/or AZO. The first transparent contact 604 can be deposited onto the substrate 602 using a process such as sputtering, evaporation, or solution processing (e.g., casting).

Optionally, an electron-blocking layer 606 is deposited onto the first transparent contact 604. According to an exemplary embodiment, the electron-blocking layer 606 is formed from a high workfunction material, such as $MoO_3$. The electron-blocking layer 606 potentially induces an electrostatic field which repels electrons from the back contact.

Figure 7:
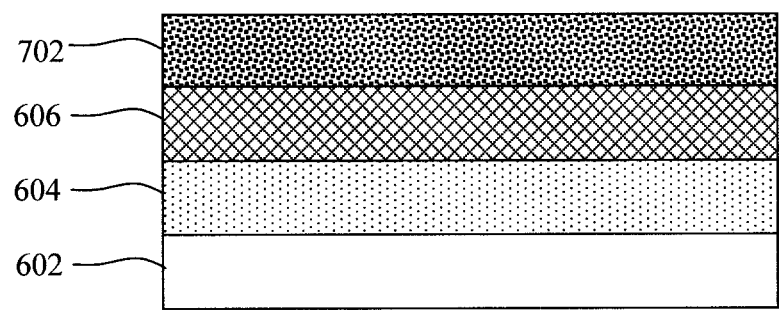
FIG. 7 is a cross-sectional diagram illustrating a p-type chalcogen absorber layer having been formed on the electron-blocking layer, if present, or directly on the first transparent contact according to an embodiment of the present invention.

A (p-type) chalcogen absorber layer 702 is then deposited on the electron-blocking layer 606, if present, or directly on the first transparent contact 604. See FIG. 7. According to an exemplary embodiment, the absorber layer 702 includes a high band gap chalcogen material such as S, Se, and/or Te. For example, in one exemplary embodiment in particular, the absorber layer 702 is formed from pure Se (i.e., the absorber layer 702 is from about 90% to about 99.999%, and ranges therebetween, Se). The absorber layer 702 can be deposited using a process such as evaporation or solution processing (e.g., casting).

Figure 8:
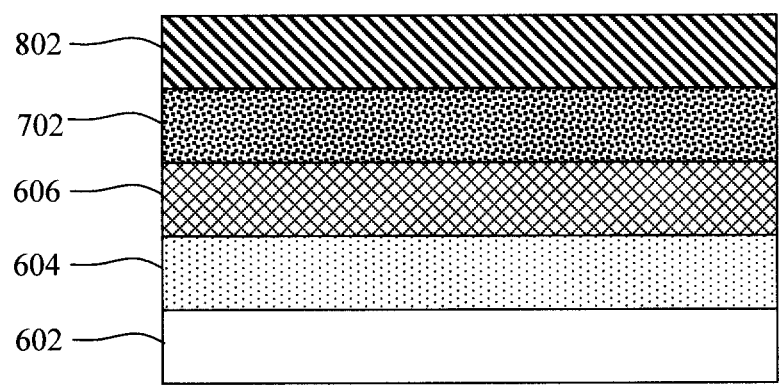
FIG. 8 is a cross-sectional diagram illustrating an n-type layer having been formed on the p-type chalcogen absorber layer according to an embodiment of the present invention.

An n-type layer 802 is next formed on the absorber layer 702. See FIG. 8. The n-type layer 802 and the (p-type) absorber layer 702 form a p-n junction therebetween. As above, suitable n-type materials include, but are not limited to, CdO, CdS, a cadmium-zinc-sulfur material of the formula $Cd_{1-x}Zn_xS$ (wherein $0<x\le1$), $In_2S_3$, zinc oxide, zinc oxysulfide (e.g., a Zn(O,S) or Zn(O,S,OH) material), $Al_2O_3$, $TiO_2$, and/or a ZMO material with the formula $Zn_{1-x}Mg_xO$, wherein $0\le x\le0.4$. The n-type material can be deposited onto the absorber layer 702 by sputtering, evaporation, or solution processing (e.g., casting), to form the n-type layer 802.

As described in detail above, the ability to form the (in this case front) transparent contact on the stack over the absorber layer 702 (and corresponding p-n junction with n-type layer 802) is a non-trivial task, since directly depositing the transparent contact would result in sputter damage (due to ion bombardment) to the n-type layer 802/absorber layer 702 p-n junction and hinder device performance. Advantageously, a protective interlayer is employed herein between the transparent contact and the absorber layer 702/n-type layer 802. This protective interlayer is placed after formation of the absorber layer 702/n-type layer 802, but before depositing the transparent contact material. Thus, the absorber layer 702/n-type layer 802 are covered/protected from damage during the front transparent contact formation.

Figure 9:
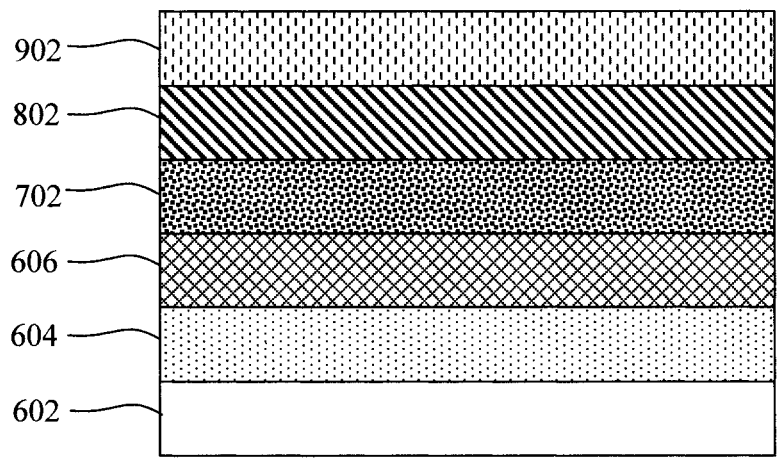
FIG. 9 is a cross-sectional diagram illustrating a protective interlayer having been deposited onto the n-type layer according to an embodiment of the present invention.

Thus, as shown in FIG. 9, a protective interlayer 902 is next deposited onto (and fully covering an exposed side of) the n-type layer 802. As shown in FIG. 9, the protective interlayer 902 fully covers/protects the n-type layer 802. Being that the protective interlayer in this substrate configuration is on a same side of the absorber layer 702 as the n-type layer 802, it is preferable that the protective interlayer 902 in this case is formed from a buffer material such as zinc oxide (ZnO), titanium dioxide ($TiO_2$), and/or aluminum oxide ($Al_2O_3$). Protective interlayer 902 serves both to provide a barrier and to potentially prevent shunting. Interlayer 902 may be deposited onto the n-type layer 802 by a soft process such as evaporation, nanoparticle or solution deposition or atomic layer deposition (ALD) to avoid damage to the p-n junction during sputter, etc. deposition of the second transparent conductive (contact) layer.

Now that the protective interlayer 902 is in place to protect the p-n junction, a second (front) transparent contact 1002 is formed on the protective interlayer 902. See FIG. 10. As provided above, the transparent contacts are preferably formed from a material having a bandgap of greater than about 2.5. For instance, according to an exemplary embodiment, the second transparent contact 1002 is formed from a TCO such as ITO, FTO, and/or AZO. The second transparent contact 1002 can be deposited onto the interlayer 902 using a process such as sputtering, evaporation, or solution processing (e.g., casting).

Figure 10:
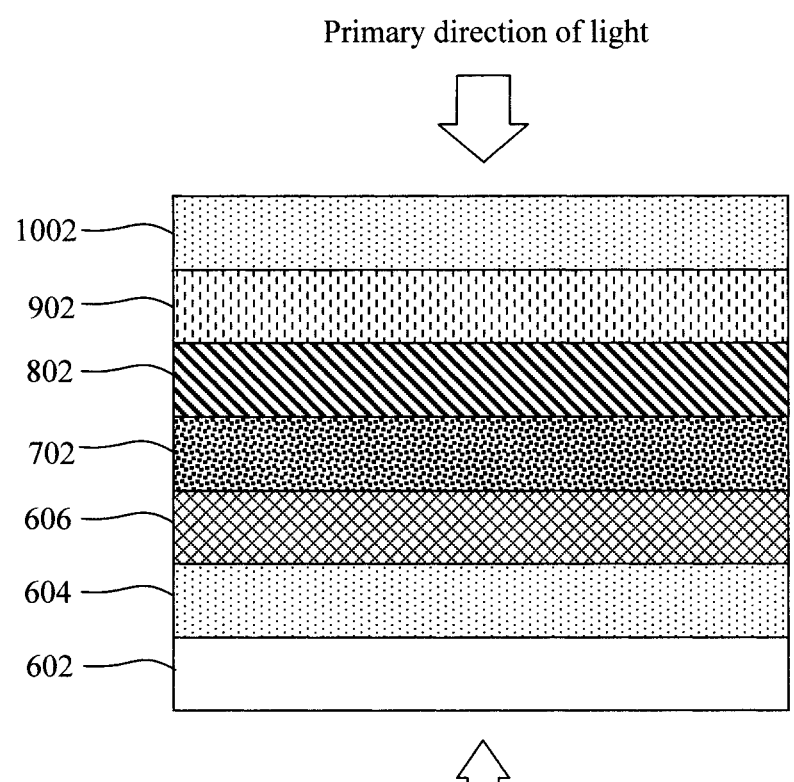
FIG. 10 is a cross-sectional diagram illustrating a second (front) transparent contact having been formed on the protective interlayer according to an embodiment of the present invention.

As shown in FIG. 10, the primary direction at which light enters the solar cell device is at an opposite end of the device stack from the substrate 602. This is the substrate configuration referenced above. However, as shown in FIG. 10, light can also enter the solar cell device at the other end, i.e., through the substrate. Namely, the ability to place transparent contacts both at the front and back of the device (and without light obstructing metal contacts) via the present interlayer enables light to enter from both the front and the back of the device, i.e., a bi-facial design wherein both sides of the solar cell device can 'face' and capture light. Thus, as described above, the present solar cell designs are capable of harnessing light energy regardless of the orientation of the solar cell device (whichever side(s) is/are facing the light).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a solar cell, the method comprising the steps of:
    forming a first transparent contact on a substrate, wherein the first transparent contact is formed as a single layer disposed on, and fully covering, the substrate;
    depositing an n-type layer directly on the first transparent contact, wherein the n-type layer comprises a material selected from the group consisting of: cadmium sulfide, a cadmium-zinc-sulfur material, indium sulfide, zinc oxysulfide, aluminum oxide, zinc magnesium oxide, and combinations thereof;
    depositing a p-type chalcogen absorber layer on the n-type layer, wherein a p-n junction is formed between the p-type chalcogen absorber layer and the n-type layer, the p-type chalcogen absorbing layer comprising only sulfur, selenium, and/or tellurium;
    depositing a protective interlayer onto the p-type chalcogen absorber layer by evaporation, wherein the protective interlayer fully covers the p-type chalcogen absorber layer, wherein the protective interlayer comprises a material having a workfunction of greater than about 5.2 electron volts, and wherein the protective interlayer comprises molybdenum trioxide; and
    forming a second transparent contact directly on the protective interlayer with the protective interlayer tuning a workfunction of the second transparent contact, wherein the protective interlayer being disposed between the p-type chalcogen absorber layer and the second transparent contact serves to protect the p-n junction during the forming of the second transparent contact.

2. The method of claim 1, wherein the substrate comprises a material selected from the group consisting of soda lime glass, plastic, polycarbonate, and combinations thereof.

3. The method of claim 1, wherein the first transparent contact and the second transparent contact each comprises a material having a bandgap greater than about 2.5 electron volts.

4. The method of claim 1, wherein the first transparent contact and the second transparent contact each comprises a transparent conducting oxide selected from the group consisting of: indium-tin-oxide, fluorine-doped tin oxide, aluminum-doped zinc oxide, and combinations thereof.

5. The method of claim 1, wherein the p-type chalcogen absorber layer comprises pure Se.

6. The method of claim 1, wherein the p-type chalcogen absorber layer has a bandgap of >1.6 electron volts and the solar cell is semitransparent with light being captured at either end of the solar cell.

7. A solar cell, comprising:
    a substrate;
    a first transparent contact disposed on the substrate, wherein the first transparent contact comprises a single layer disposed on, and fully covering, the substrate;
    an n-type layer disposed directly on the first transparent contact, wherein the n-type layer comprises a material selected from the group consisting of: cadmium sulfide, a cadmium-zinc-sulfur material, indium sulfide, zinc oxysulfide, aluminum oxide, zinc magnesium oxide, and combinations thereof;

a p-type chalcogen absorber layer disposed on the n-type layer, wherein a p-n junction is formed between the p-type chalcogen absorber layer and the n-type layer, the p-type chalcogen absorbing layer comprising only sulfur, selenium, and/or tellurium;

a protective interlayer disposed on the p-type chalcogen absorber layer, wherein the protective interlayer fully covers the p-type chalcogen absorber layer, wherein the protective interlayer comprises a material having a workfunction of greater than about 5.2 electron volts, and wherein the protective interlayer comprises molybdenum trioxide; and a second transparent contact disposed directly on the protective interlayer.

8. The solar cell of claim 7, wherein the first transparent contact and the second transparent contact each comprises a transparent conducting oxide selected from the group consisting of: indium-tin-oxide, fluorine-doped tin oxide, aluminum-doped zinc oxide, and combinations thereof.

9. The solar cell of claim 7, wherein the p-type chalcogen absorber layer comprises pure Se.

* * * * *